US012785836B2

(12) United States Patent
Isakanian et al.

(10) Patent No.: US 12,785,836 B2
(45) Date of Patent: Nov. 3, 2026

(54) SIGNAL TRANSMITTER CIRCUIT INCLUDING MAIN FULL UNIT INTERVAL (UI) TRANSMIT DRIVER AND MID-SUB-UI BOOST DRIVER

(71) Applicant: QUALCOMM Incorporated, San Diego, CA (US)

(72) Inventors: Patrick Isakanian, El Dorado Hills, CA (US); Jaseem Ahammed, San Marcos, CA (US)

(73) Assignee: QUALCOMM Incorproated, San Diego, CA (US)

( * ) Notice: Subject to any disclaimer, the term of this patent is extended or adjusted under 35 U.S.C. 154(b) by 293 days.

(21) Appl. No.: 18/478,011

(22) Filed: Sep. 29, 2023

(65) Prior Publication Data

US 2025/0112717 A1 Apr. 3, 2025

(51) Int. Cl.

| | |
|---|---|
| ***H04J 3/06*** | (2006.01) |
| ***H03K 19/003*** | (2006.01) |
| ***H03K 19/0175*** | (2006.01) |
| ***H04L 25/02*** | (2006.01) |

(52) U.S. Cl.
CPC .......... *H04J 3/06* (2013.01); *H03K 19/00346* (2013.01); *H03K 19/017509* (2013.01); *H04L 25/028* (2013.01)

(58) Field of Classification Search
CPC . H04J 3/06; H03K 19/0008; H03K 19/00346; H03K 19/017509; H03K 19/017545; H03K 19/018507; H03K 19/018557; H04L 25/028
See application file for complete search history.

(56) References Cited

U.S. PATENT DOCUMENTS

| | | | | |
|---|---|---|---|---|
| 9,148,130 | B1 | 9/2015 | Naviasky et al. | |
| 10,439,661 | B1 | 10/2019 | Heydari | |
| 11,481,148 | B1 | 10/2022 | Kumar et al. | |
| 2011/0221521 | A1 | 9/2011 | Razzell et al. | |
| 2018/0227001 | A1 | 8/2018 | Chong et al. | |
| 2022/0045675 | A1* | 2/2022 | Gu | G11C 7/1084 |
| 2022/0255548 | A1* | 8/2022 | Xu | H03K 19/20 |

OTHER PUBLICATIONS

International Search Report and Written Opinion—PCT/US2024/045608—ISA/EPO—Dec. 19, 2024.

* cited by examiner

*Primary Examiner* — Daniel D Chang
(74) *Attorney, Agent, or Firm* — Loza & Loza, LLP

(57) ABSTRACT

An apparatus and method of generating an output transmit signal including generating a first portion of an output transmit signal based on an input transmit signal, wherein the first portion of the output transmit signal includes a first set of pulses each spanning a unit interval (UI); generating a second portion of the output transmit signal based on the input transmit signal, wherein the second portion of the output signal includes a second set of pulses each spanning a middle sub-interval of the UI; and combining the first portion with the second portion to generate the output transmit signal.

24 Claims, 6 Drawing Sheets

SIGNAL TRANSMITTER CIRCUIT INCLUDING MAIN FULL UNIT INTERVAL (UI) TRANSMIT DRIVER AND MID-SUB-UI BOOST DRIVER

FIELD

Aspects of the present disclosure relate generally to data communication links, and in particular, to a signal transmitter circuit including a main (full unit interval (UI)) transmit driver and a mid-sub-UI boost driver.

BACKGROUND

Data communication links, such as serializer/deserializer (SERDES) links, are used to communicate data/clock signals between integrated circuits (ICs) and other components. When the signal rate or frequency of the data/clock signals is sufficiently high (e.g., >one (1) giga Hertz (GHz)), signal reflections may occur along the transmission of the data/clock signals between ICs. To reduce such signal reflections, termination resistors are employed at both signal transmitter and receiver circuits, wherein the resistance of each of the termination resistors is set to a characteristic impedance (e.g., 50 Ohms (Ω)) of a transmission line by way the signals propagate. However, the termination resistors may cause the data communication link to consume higher power.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a first transmit driver including an input coupled to a signal input; a first delay circuit including an input coupled to the signal input; a second delay circuit including an input coupled to the signal input or an output of the first delay circuit; an inverting circuit including an input coupled to an output of the second delay circuit; a logic gate including inputs coupled to outputs of the first delay circuit and the inverting circuit, respectively; and a second transmit driver including an input coupled to an output of the logic gate, and an output coupled to an output of the first transmit driver.

Another aspect of the disclosure relates to an apparatus. The apparatus includes: a full unit interval (UI) transmit driver including an input coupled to a signal input; and a mid-sub-UI boost driver including an input coupled to the signal input and an output coupled to an output of the full UI transmit driver.

Another aspect of the disclosure relates to an apparatus. The apparatus includes a full-UI transmit driver configured to generate a first portion of an output transmit signal based on an input transmit signal, wherein the first portion of the output transmit signal includes a first set of pulses each spanning a unit interval (UI); and a mid-sub-UI boost driver configured to generate a second portion of the output transmit signal based on the input transmit signal, wherein the second portion of the output transmit signal includes a second set of pulses each spanning a middle sub-interval of the UI.

Another aspect of the disclosure relates to a method. The method includes generating a first portion of an output transmit signal based on an input transmit signal, wherein the first portion of the output transmit signal includes a first set of pulses each spanning a unit interval (UI); generating a second portion of the output transmit signal based on the input transmit signal, wherein the second portion of the output transmit signal includes a second set of pulses each spanning a middle sub-interval of the UI; and combining the first portion with the second portion to generate the output transmit signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "coupled" as used herein may refer to electrically coupled.

To reduce signal reflections, termination resistors at transmitter circuit and receiver circuit are employed, which may cause the data communication link to consume higher power. In case the receiver circuit does not include the receiver termination resistor, it may have power saving advantages, but signal reflections may occur at the receiver circuit. Such signal reflections may compromise the signal integrity of the received signal at the receiver circuit. For example, the received signal includes a high-side dip and a low-side bump located substantially in the middle of the unit interval (UI) of the received signal. The UI co-located high-side dip and low-side bump tend to reduce the height of the eye diagram corresponding to the received signal, which makes it more difficult for the receiver circuit to detect the transmitted data/clock.

A signal transmitter circuit is proposed which includes a main (full-UI) transmit driver and a mid-sub-UI transmit boost driver. The mid-sub-UI transmit boost driver is configured to amplify and/or voltage level shift a middle sub-interval of the UI of the input transmit signal to generate a second, boosted, portion of the transmit signal. The boosted portion of the transmit signal substantially coincides with the high-side dip that would otherwise be present in the received signal, the high-side dip is reduced or substantially eliminated from the received signal. This opens or increases the height of the eye diagram, which improves the detectability of the data/clock in the received signal without increasing the supply voltage of the main transmit driver.

Figure 1:
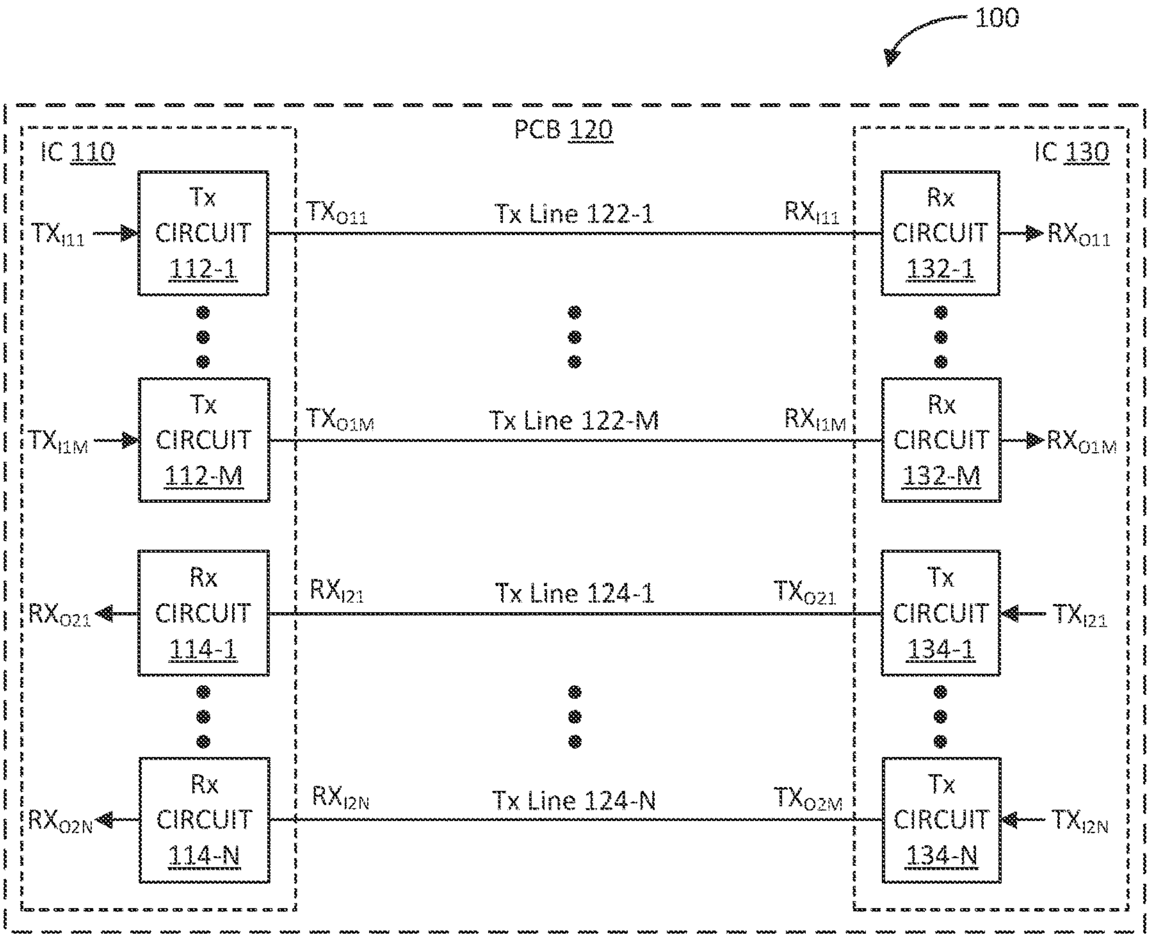
FIG. 1 illustrates a block diagram of an example data/clock communication apparatus in accordance with an aspect of the disclosure.

FIG. 1 illustrates a block diagram of an example data/clock communication apparatus 100 in accordance with an aspect of the disclosure. The data/clock communication apparatus 100 may facilitate serializer-deserializer (SERDES) type of data/clock communication, as in a low power double data rate (LPDDR) memory (e.g., dynamic random access memory (DRAM)) interface, or other type of input/output (I/O) data/clock interface.

In particular, the data/clock communication apparatus 100 includes a first integrated circuit (IC) 110 and a second IC 130, both of which may be securely mounted on a printed circuit board (PCB) 120. The first IC 110 may include a set of one or more signal transmitter (Tx) circuits 112-1 to 112-M. To implement bidirectional data/clock communication, the first IC 110 may further include a set of one or more signal receiver (Rx) circuits 114-1 to 114-N. Although the data/clock communication apparatus 100 is described as being bidirectional, it shall be understood that the data/clock communication apparatus 100 may be configured for unidirectional data communication. In such case, the first IC 110 may not include the set of one or more signal receiver circuits 114-1 to 114-N. Further, it shall be understood that the signal transmitter circuits 112-1 to 112-M may share the same transmission lines as the signal receiver circuits 114-1 to 114-N (e.g., where N=M) in a time division multiplexing (TDM) manner.

The set of one or more signal transmitter circuits 112-1 to 112-M are configured to receive a set of one or more input transmit data/clock signals $TX_{I11}$ to $TX_{I1M}$ (e.g., one of the signals may be a clock signal, and the remaining signals may be data signals) and generate a set of one or more output transmit data/clock signals $TX_{O11}$ to $TX_{O1M}$ based on the set of one or more input transmit data/clock signals $TX_{I11}$ to $TX_{I1M}$, respectively. The set of one or more signal transmitter circuits 112-1 to 112-M are coupled to a first set of one or more transmission lines (e.g., metal traces) 122-1 to 122-M of the PCB 120 for transmission of the set of one or more output transmit data/clock signals $TX_{O11}$ to $TX_{O1M}$ to the second IC 130, respectively.

The set of one or more signal receiver circuits 114-1 to 114-N are coupled to a second set of one or more transmission lines (e.g., metal traces) 124-1 to 124-N of the PCB 120 to receive a set of one or more input receive data/clock signals $RX_{I21}$ to $RX_{I2N}$ (e.g., one of the signals may be a clock signal, and the remaining signals may be data signals) from the second IC 130, respectively. The set of one or more signal receiver circuits 114-1 to 114-N are configured to generate a set of one or more output receive data/clock signals $RX_{O21}$ to $RX_{O2N}$ based on (e.g., by processing) the set of one or more input receive data/clock signals $RX_{I21}$ to $RX_{I2N}$, respectively.

The second IC 130 may include a set of one or more signal receiver (Rx) circuits 132-1 to 132-M. To implement bidirectional data communication, as discussed, the second IC 130 may further include a set of one or more signal transmitter (Tx) circuits 134-1 to 134-N. Also, as discussed, although the data/clock communication apparatus 100 is described as being bidirectional, it shall be understood that the data/clock communication apparatus 100 may be configured for unidirectional data communication. In such case, the second IC 130 may not include the set of one or more signal transmitter circuits 134-1 to 134-N.

The set of one or more signal receiver circuits 132-1 to 132-M are coupled to the first set of one or more data transmission lines 122-1 to 122-M to receive a set of one or more input receive data/clock signals $RX_{I11}$ to $RX_{I1M}$ based on the set of one or more output transmit data/clock signals $TX_{O11}$ to $TX_{O1M}$ from the first IC 110, respectively. The set of one or more signal receiver circuits 132-1 to 132-M are configured to generate a set of one or more output receive data/clock signals $RX_{O11}$ to $RX_{O1M}$ based on (e.g., by processing) the set of one or more input receive data/clock signals $RX_{I11}$ to $RX_{I1M}$, respectively.

The set of one or more signal transmitter circuits 134-1 to 134-N are configured to receive a set of one or more input transmit data/clock signals $TX_{I21}$ to $TX_{I2N}$, and generate the set of one or more output data/clock signals $TX_{O21}$ to $TX_{O2N}$, based on the set of one or more input transmit data signals $TX_{I21}$ to $TX_{I2N}$, respectively. The set of one or more signal transmitter circuits 134-1 to 134-N are coupled to the second set of one or more transmission lines 124-1 to 124-N for transmitting the set of one or more output transmit data signals $TX_{I21}$ to $TX_{I2N}$ to the first IC 110, respectively. The set of one or more input receive data/clock signals $RX_{I21}$ to $RX_{I2N}$ are based on the set of one or more output transmit data signals $TX_{I21}$ to $TX_{I2N}$, respectively.

Figure 2:
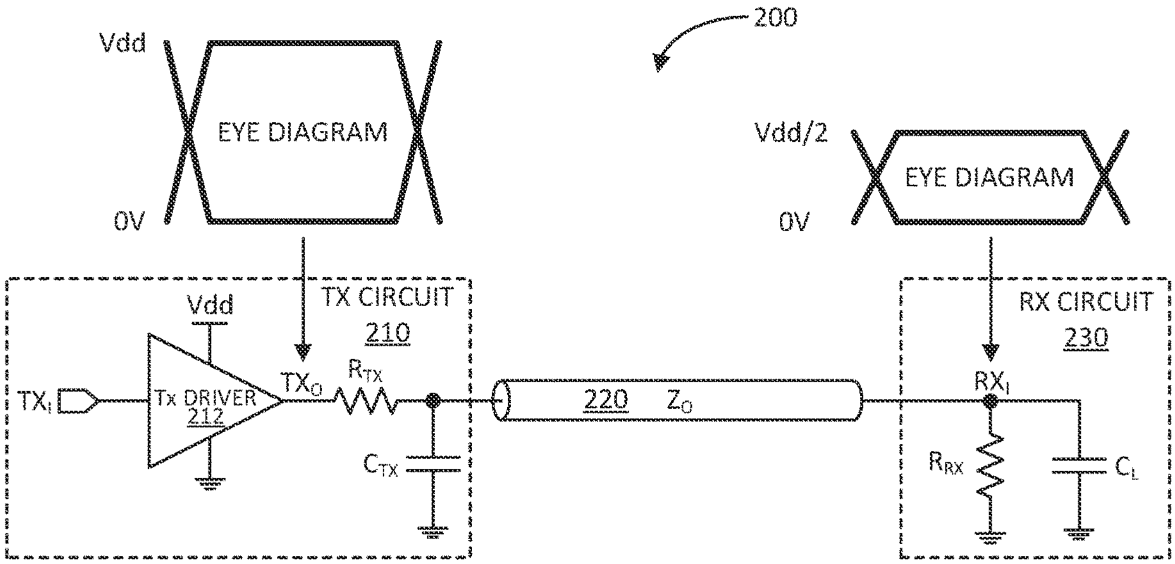
FIG. 2 illustrates a block/schematic diagram of an example signal communication apparatus in accordance with another aspect of the disclosure.

FIG. 2 illustrates a block/schematic diagram of an example signal communication apparatus 200 in accordance with another aspect of the disclosure. The signal communication apparatus 200 may be an example implementation of any of the M+N data/clock lanes (e.g., transmitter circuit-transmission line-receiver circuit) of the data/clock communication apparatus 100. The signal communication apparatus 200 may also be an example of a "terminated" signal communication link, as discussed further herein.

In particular, the signal communication apparatus 200 includes a signal transmitter circuit 210, a signal receiver circuit 230, and a transmission line 220 coupling the signal transmitter circuit 210 to the signal receiver circuit 230. The signal transmitter circuit 210, in turn, includes a transmit (Tx) driver 212, a transmitter termination resistor $R_{TX}$, and a transmitter shunt capacitor $C_{TX}$. The transmit driver 212, which may be coupled to and receive power from upper and lower voltage rails Vdd and Vss (e.g., ground), is configured to receive an input transmit signal $TX_I$, and generate an output transmit signal $TX_O$ based on (e.g., by amplifying and/or voltage level shifting) the input transmit signal $TX_I$.

The transmitter termination resistor $R_{TX}$ is coupled between the output of the transmit driver 212 and the transmission line 220, and the transmitter shunt capacitor $C_{TX}$ is coupled between the first end of the transmission line 220 and ground. As the transmit signal $TX_O$ may have a relatively high frequency or data/clock rate (e.g., >one (1) giga Hertz (GHz)), the transmit signal $TX_O$ may be subjected to signal reflections due to impedance mismatch. Accordingly, to prevent or reduce signal reflections at the signal transmitter circuit 210, the transmitter termination resistor $R_{TX}$ may be implemented with a resistance substantially the same as a characteristic impedance $Z_O$ (e.g., 50 Ohms (22)) of the transmission line 220.

The signal receiver circuit 230 may include a load represented as a load capacitor CL coupled between a second end of the transmission line 220 and a lower voltage rail $V_{SS}$ (e.g., ground). The load capacitor CL is configured to receive an input receive signal $R_{XI}$ (e.g., based on the output transmit signal $TX_O$) via the transmission line 220. The signal receiver circuit 230 further includes a receiver termination resistor $R_{RX}$ coupled between the second end of the transmission line 220 and ground. Similarly, to prevent or reduce signal reflections at the signal receiver circuit 230, the receiver termination resistor $R_{RX}$ may be implemented with a resistance substantially the same as the characteristic impedance $Z_O$ (e.g., 50Ω) of the transmission line 220.

As the signal communication apparatus 200 is "terminated" (e.g., includes termination resistors $R_{TX}$ and $R_{RX}$ both at the transmitter and receiver circuits 210 and 230, respectively), the signal integrity of the receive signal $R_{XI}$ is substantially unchanged with respect to the transmit signal $TX_O$ (e.g., both being substantially square wave as indicated by the corresponding eye diagrams). A drawback of the "terminated" signal communication apparatus 200 is that it may consume significant direct current (DC) power in the form of a DC current flowing from the upper supply voltage rail Vdd to the lower supply voltage rail Vss (e.g., ground) via the transmit driver 212, the transmitter termination resistor $R_{TX}$, the transmission line 220, and the receiver termination resistor $R_{RX}$. Additionally, the voltage swing of the receive signal $RX_I$ may be substantially half (e.g., Vdd/2 to zero (0) Volt (V)) compared to the voltage swing of the transmit signal (e.g., Vdd to 0V).

Figure 3:
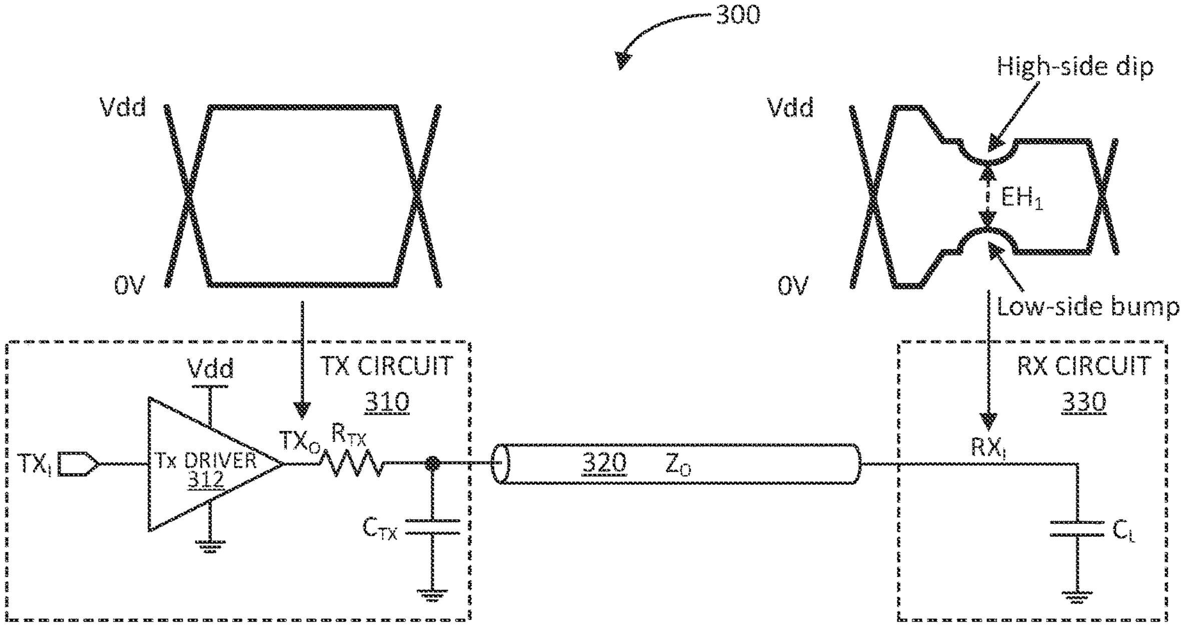
FIG. 3 illustrates a block/schematic diagram of another example signal communication apparatus in accordance with another aspect of the disclosure.

FIG. 3 illustrates a block/schematic diagram of another example signal communication apparatus 300 in accordance with another aspect of the disclosure. The signal communication apparatus 300 is similar to signal communication apparatus 200 previously discussed, and includes many of the same/similar elements as indicated by the same labels and reference numbers but with the most significant digit being a "3" in signal communication apparatus 300 as opposed to a "2" as in signal communication apparatus 200. Similarly, the signal communication apparatus 300 may be an example implementation of any of the data/clock lanes of the data/clock communication apparatus 100.

In contrast, the signal communication apparatus 300 may be an example of an "unterminated" signal communication link as the signal receiver circuit 330 does not include a receiver termination resistor $R_{RX}$. As a consequence, a DC current path does not generally exist between the transmitter supply voltage rail Vdd and the receiver lower supply voltage rail Vss (e.g., ground) via the transmit driver 312, the transmitter termination resistor $R_{TX}$, and the transmission line 320. Accordingly, the signal communication apparatus 300 may have power saving advantage as it does not consume the DC power due to the absentee DC current flowing between the transmitter circuit 310 and the receiver circuit 330.

However, as the receiver circuit 330 does not include the receiver termination resistor $R_{RX}$, signal reflections may occur at the receiver circuit 330. Such signal reflections may compromise the signal integrity of the received signal $R_{XI}$ at the receiver circuit 330. For example, as depicted in the eye diagram corresponding to the received signal $R_{XI}$, the received signal $R_{XI}$ includes a high-side dip and a low-side bump located substantially in the middle of the unit interval (UI) of the received signal $R_{XI}$. The UI co-located high-side dip and low-side bump tend to reduce the height ($EH_1$) of the eye diagram, which makes it more difficult for the receiver circuit 330 to detect the transmitted data/clock. In some cases, a solution to increase the eye diagram height $EH_1$ is to increase the transmitter supply voltage Vdd. However, that solution has a drawback of causing the signal communication apparatus 300 to consume more power, which is also counter to a desire of reducing the transmitter supply voltage Vdd for power conservation purposes.

Figure 4:
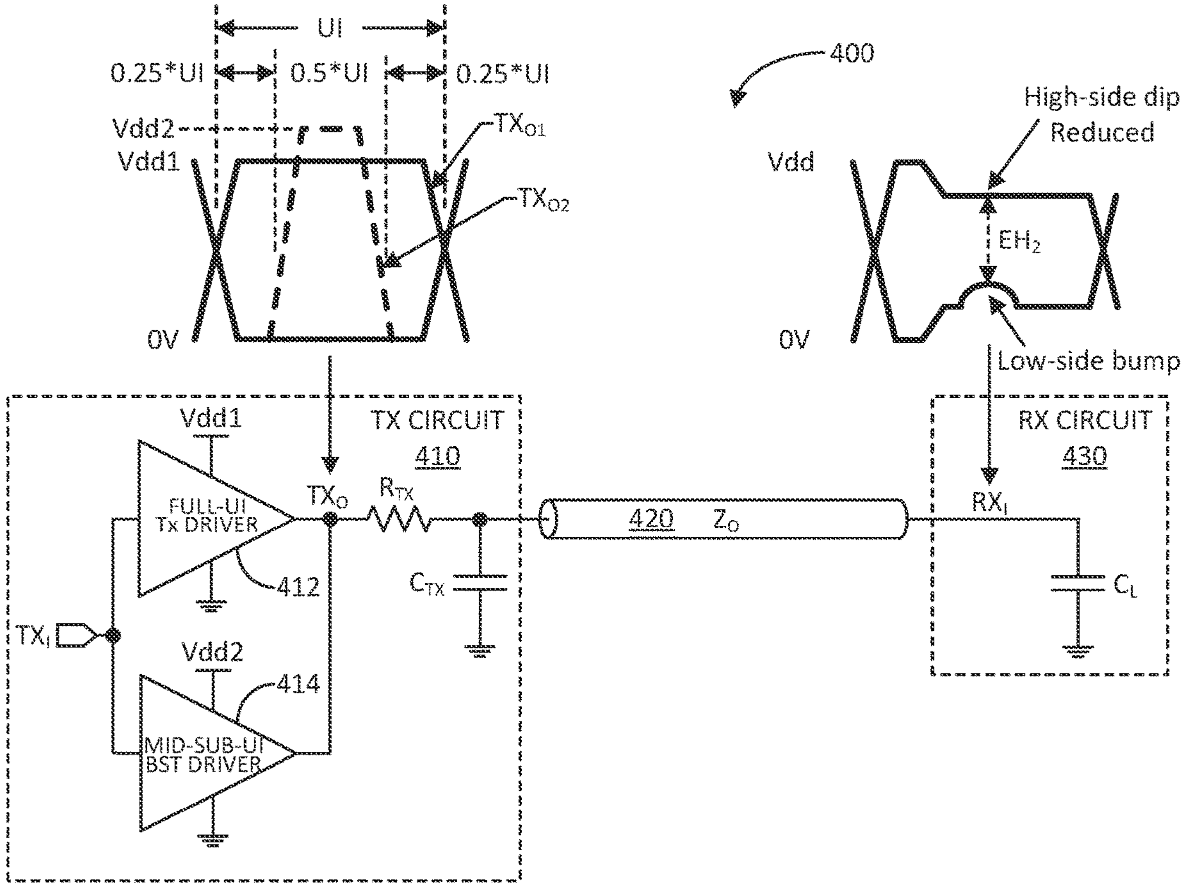
FIG. 4 illustrates a block/schematic diagram of another example signal communication apparatus in accordance with another aspect of the disclosure.

FIG. 4 illustrates a block/schematic diagram of another example signal communication apparatus 400 in accordance with another aspect of the disclosure. As discussed in more detail further herein, the signal communication apparatus 400 includes a signal transmitter circuit configured to generate an output transmit signal $TX_O$ that includes a mid-UI voltage boost to reduce or substantially eliminate the high-side dip in a received signal $RX_I$ at an unterminated signal receiver circuit. Similarly, the signal communication apparatus 400 may be an example implementation of any of the data/clock lanes of the data/clock communication apparatus 100.

In particular, the signal communication apparatus 400 includes a signal transmitter circuit 410, a signal receiver circuit 430, and a transmission line 420 coupling the signal transmitter circuit 410 to the signal receiver circuit 430. The signal transmitter circuit 410, in turn, includes a main (full-UI) transmit driver 412, a mid-sub-UI transmit boost driver 414, a transmitter termination resistor $R_{TX}$, and a transmitter shunt capacitor $C_{TX}$. The main (full-UI) transmit driver 412, which may be coupled to and receive power from upper and lower voltage rails Vdd1 and Vss (e.g., ground), is configured to receive an input transmit signal $TX_I$, and generate a first portion $TX_{O1}$ of an output transmit signal $TX_O$ based on the input transmit signal $TX_I$. That is, the input transmit signal $TX_I$ may be a data or clock signal with a particular unit interval (UI) (e.g., a half period of the clock signal). Accordingly, the main transmit driver 412 is configured to amplify and/or voltage level shift the input transmit signal $TX_I$ to generate the first portion $TX_{O1}$ of the output transmit signal $TX_{O1}$ such that it has substantially the same UI as the input transmit signal $TX_I$, as indicated by the solid line of the corresponding eye diagram.

The mid-sub-UI transmit boost driver 414, which may be coupled to and receive power from upper and lower voltage rails Vdd2 and Vss (e.g., ground), is configured to receive the input transmit signal $TX_I$, and generate a second portion of the output transmit signal $TX_{O2}$ based on the input transmit signal $TX_I$. The mid-sub-UI transmit boost driver 414 is configured to amplify and/or voltage level shift a middle sub-interval of the UI of the input transmit signal $TX_I$ to generate the second portion of the output transmit signal $TX_{O2}$, as indicated by the dashed line of the corresponding eye diagram. The middle sub-interval of the UI may substantially coincide with the high-side dip that would otherwise occur in the received signal $R_{XI}$ at the signal receiver circuit 430.

In this example, the middle boosted sub-interval of the UI may begin at 0.25*UI and may end at 0.75*UI. However, it shall be understood that the middle boosted sub-interval of the UI may begin and end at different positive percentages of the UI, and need not be symmetrical with respect to the middle of the UI. Although identified differently, the upper supply voltage rail Vdd1 of the main transmit driver 412 may be the same or different than the upper supply voltage rail Vdd2 of the mid-sub-UI transmit boost driver 414. If different, the supply voltage Vdd2 for the mid-sub-UI transmit boost driver 414 may be set higher than the supply voltage Vdd1 of the main transmit driver 412, as indicated in the corresponding eye diagram. The outputs of the main transmit driver 412 and mid-sub-UI boost driver 414 are coupled together so that the first and second signal portions $TX_{O1}$ and $TX_{O2}$ combine or sum to form the output transmit signal $TX_O$. Accordingly, the output transmit signal $TX_O$ includes a set of positive pulses being a combination of a first set of full-UI positive pulses generated by the main transmit driver 412 and a second set of coincidental mis-sub-UI positive pulses generated by the mid-sub-UI transmit boost driver 414, respectively.

The remaining circuitry of the signal communication apparatus 400 may be substantially the same or similar to the signal communication apparatus 300 previously discussed. That is, the transmitter termination resistor $R_{TX}$ may be coupled between the outputs of the main transmit driver 412/mid-sub-UI boost driver 414 and a first end of the transmission line 420. The transmitter capacitor $C_{TX}$ may be coupled between the first end of the transmission line 420 and the lower voltage rail Vss (e.g., ground). The transmitter termination resistor $R_{TX}$ may be implemented with a resistance substantially the same as the characteristic impedance $Z_O$ of the transmission line 420.

The signal receiver circuit 430 includes a load represented as a load capacitor $C_L$ coupled between a second end of the transmission line 420 and the lower voltage rail Vss (e.g., ground). As the signal receiver circuit 430 is unterminated, the received signal $RX_I$ based on the transmit signal $TX_O$ received from the transmitter circuit 410 via the transmission line 420 has some signal integrity issues, as previously discussed. However, due to the boosted portion $TX_{O2}$ of the transmit signal $TX_O$ substantially coinciding with the high-side dip that would otherwise be present in the received signal $RX_I$, the high-side dip is reduced or substantially eliminated from the received signal $RX_I$, as depicted in the corresponding eye diagram. This opens or increases the height $EH_2$ of the eye diagram compared $EH_1$ of the signal communication apparatus 300 (e.g., $EH_2>EH_1$), which improves the detectability of the data/clock in the received signal $RX_I$ without increasing the supply voltage Vdd1 of the main transmit driver 412 (or even lowering it for power saving purposes).

Figure 5:
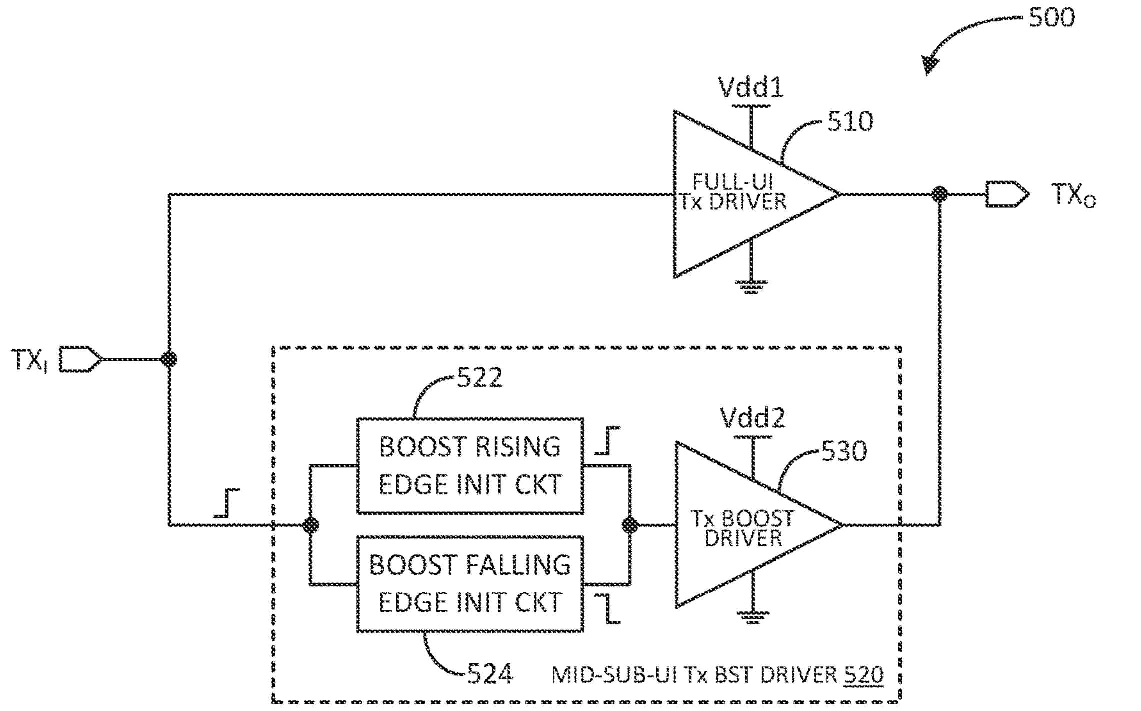
FIG. 5 illustrates a block diagram of an example signal transmitter circuit in accordance with another aspect of the disclosure.

FIG. 5 illustrates a block diagram of an example signal transmitter circuit 500 in accordance with another aspect of the disclosure. The signal transmitter circuit 500 may be an example more detailed implementation of the signal transmitter circuit 410 of signal communication apparatus 400. In particular, the signal transmitter circuit 500 includes a main (full-UI) transmit (Tx) driver 510 and a mid-sub-UI transmit boost driver 520. The main transmit driver 510 and the mid-sub-UI boost driver 520 include respective inputs coupled to a signal input of the transmitter circuit 500 to receive an input transmit signal $TX_I$, and respective outputs coupled together to collectively generate an output transmit signal $TX_O$ based on the input transmit signal $TX_I$.

The main transmit driver 510 is configured to generate a first portion $TX_{O1}$ of the output transmit signal $TX_O$ based on the input transmit signal $TX_I$. That is, the main transmit driver 510, which may be coupled to and receive power from upper and lower supply voltage rails Vdd1 and Vss (e.g., ground), is configured to amplify and/or voltage level shift the input transmit signal $TX_I$ to generate the first portion $TX_{O1}$ of the output transmit signal $TX_O$ such that it has positive pulses each spanning the full UI of the input transmit signal $TX_I$, as indicated by the solid line of the eye diagram corresponding to $TX_{O1}$ shown in FIG. 4.

The mid-sub-UI transmit boost driver 520, which may be coupled to and receive power from upper and lower voltage rails Vdd2 and Vss (e.g., ground), is configured to generate a second portion $TX_{O2}$ of the output transmit signal $TX_O$ based on the input transmit signal $TX_I$. The mid-sub-UI transmit boost driver 520 is configured to amplify and/or voltage level shift a middle sub-interval of the UI of the input transmit signal $TX_I$ to generate the second portion $TX_{O2}$ (e.g., mid-sub-UI coincidental positive pulses) of the output transmit signal $TX_O$, as indicated by the dashed line of the eye diagram corresponding to $TX_{O2}$ shown in FIG. 4. As discussed, the middle sub-interval of the UI may substantially coincide with the high-side dip that would otherwise occur in a received signal $RX_I$ at an unterminated signal receiver circuit.

More specifically, the mid-sub-UI transmit boost driver 520 includes a boost pulse rising edge initiating circuit 522, a boost pulse falling edge initiating circuit 524, and a transmit boost driver 530. The boost pulse rising edge initiating circuit 522 and the boost pulse falling edge initiating circuit 524 include respective inputs coupled to the signal input of the transmitter circuit 500 to receive the input transmit signal $TX_I$. The boost pulse rising edge initiating circuit 522 and the boost pulse falling edge initiating circuit 524 include respective outputs coupled to an input of the transmit boost driver 530. The transmit boost driver 530, which may be coupled to and receive power from upper and lower voltage rails Vdd2 and Vss (e.g., ground), is configured to generate the second or boost portion $TX_{O2}$ based on the rising and falling edge initiating signals. As previously discussed, the supply voltage Vdd2 for the transmit boost driver 530 may be substantially the same or higher than the supply voltage Vdd1 for the main transmit driver 510. As previously indicated, the transmit boost driver 530 includes an output coupled to the output of the main transmit driver 510.

In operation, the boost pulse rising edge initiating circuit 522 is configured to generate a rising edge initiating signal in response to a rising edge of the input transmit signal $TX_I$. In response to the rising edge initiating signal, the transmit boost driver 530 generates a rising edge of the second or boost portion $TX_{O2}$ of the output transmit signal $TX_O$. The boost pulse rising edge initiating circuit 522 may generate the rising edge initiating signal a first time interval (e.g., 0.25*UI) after the rising edge of the input transmit signal $TX_I$. Similarly, the boost pulse falling edge initiating circuit 524 is configured to generate a falling edge initiating signal in response to the rising edge of the input transmit signal $TX_I$. In response to the falling edge initiating signal, the transmit boost driver 530 generates a falling edge of the second or boost portion $TX_{O2}$ of the output transmit signal $TX_O$. The boost pulse falling edge initiating circuit 524 may generate the falling edge initiating signal a second time interval (e.g., 0.75*UI) after the rising edge of the input transmit signal $TX_I$ (e.g., which translates to a time interval of 0.25*UI prior to the falling edge of the coincidental full-UI positive pulse generated by the main transmit driver 510). As the outputs of the main transmit driver 510 and the transmit boost driver 530 are coupled together, the first and second portions $TX_{O1}$ and $TX_{O2}$ combine or sum to form the output transmit signal $TX_O$.

Figure 6A:
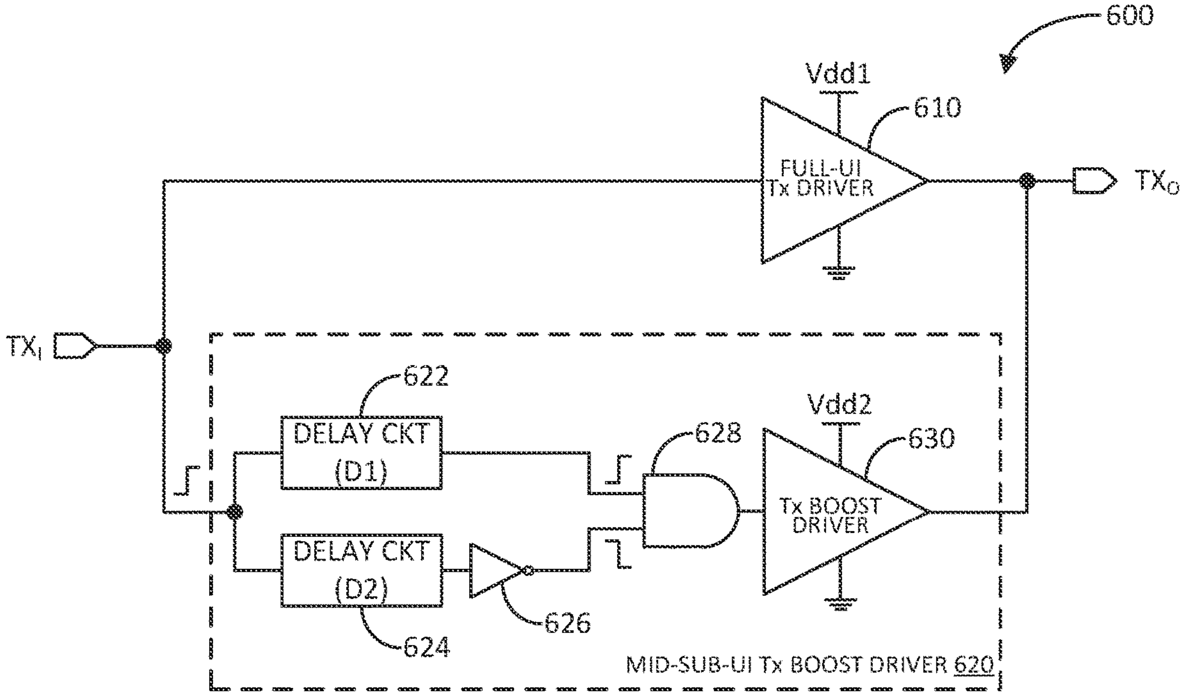
FIGS. 6A-6B illustrate block diagrams of a couple of example variations of a signal transmitter circuit in accordance with another aspect of the disclosure.

FIG. 6A illustrates a block diagram of another signal transmitter circuit 600 in accordance with another aspect of the disclosure. The signal transmitter circuit 600 may be an example more detailed implementation of the signal transmitter circuit 500. In particular, the signal transmitter circuit 600 includes a main (full-UI) transmit (Tx) driver 610 and a mid-sub-UI transmit boost driver 620. The main transmit driver 610 and the mid-sub-UI transmit boost driver 620 include respective inputs coupled to a signal input of the transmitter circuit 600 to receive an input transmit signal $TX_I$, and respective outputs coupled together to collectively generate an output transmit signal $TX_O$ based on the input transmit signal $TX_I$.

The main transmit driver 610 is configured to generate a first portion $TX_{O1}$ of the output transmit signal $TX_O$ based on the input transmit signal $TX_I$. That is, the main transmit driver 610, which may be coupled to and receive power from upper and lower supply voltage rails Vdd1 and Vss (e.g., ground), is configured to amplify and/or voltage level shift the input transmit signal $TX_I$ to generate the first portion $TX_{O1}$ of the output transmit signal $TX_O$ such that it has positive pulses each spanning the full UI of the input transmit signal $TX_I$, as indicated by the solid line of the eye diagram corresponding to $TX_{O1}$ shown in FIG. 4.

The mid-sub-UI transmit boost driver 620, which may be coupled to and receive power from upper and lower voltage rails Vdd2 and Vss (e.g., ground), is configured to generate a second portion $TX_{O2}$ of the output transmit signal $TX_O$ based on the input transmit signal $TX_I$. The mid-sub-UI boost driver 620 is configured to amplify and/or voltage level shift a middle sub-interval of the UI of the input transmit signal $TX_I$ to generate the second portion $TX_{O2}$ (e.g., mid-sub-UI coincidental positive pulses) of the output transmit signal $TX_O$, as indicated by the dashed line of the eye diagram corresponding to $TX_{O2}$ shown in FIG. 4. As discussed, the middle sub-interval of the UI may substantially coincide with the high-side dip that would otherwise occur in a received signal $R_{XT}$ at an unterminated signal receiver circuit.

More specifically, the mid-sub-UI transmit boost driver 620 includes a first delay circuit 622, a second delay circuit 624, an inverting circuit (e.g., an inverter, a NAND gate with an input fixed to a logic one (1), a NOR gate with an input fixed to a logic zero (0), etc.) 626, a logic (e.g., AND, AND function, exclusive-NOR (XNOR), or other) gate 628, and a transmit boost driver 630. Comparing the mid-sub-UI transmit boost driver 620 with the mid-sub-UI transmit boost driver 520, the first delay circuit 622 may correspond to the boost pulse rising edge initiating circuit 522, and the cascaded second delay circuit 624 and inverting circuit 626 may correspond to the boost pulse falling edge initiating circuit 524. The logic gate 628 is configured to logically AND a rising edge initiating signal generated by the first delay circuit 622 with a falling edge initiating signal generated by the cascaded second delay circuit 624 and inverting circuit 626 to generate a boost pulse initiating signal for the transmit boost driver 630.

The first and second delay circuits 622 and 624 include respective inputs coupled to the signal input of the transmitter circuit 600 to receive the input transmit signal $TX_I$. The first and second delay circuits 622 and 624 include outputs coupled to inputs of the logic gate 628, respectively. The logic gate 628 includes an output coupled to an input of the transmit boost driver 630. The transmit boost driver 630, which may be coupled to and receive power from upper and lower voltage rails Vdd2 and Vss (e.g., ground), is configured to generate the second or boost portion $TX_{O2}$ based on the boost pulse initiating signal generated by the logic gate 628. As previously discussed, the supply voltage Vdd2 for the transmit boost driver 630 may be substantially the same or higher than the supply voltage Vdd1 for the main transmit driver 610. As previously indicated, the transmit boost driver 630 includes an output coupled to the output of the main transmit driver 610.

In operation, the first delay circuit 622 is configured to delay a rising edge of the input transmit signal $TX_I$ by a first delay D1 to generate the rising edge initiating signal. The first delay D1 may be set to a first sub-UI (e.g., 0.25*UI). Similarly, the second delay circuit 624 is configured to delay the rising edge of the input transmit signal $TX_I$ by a second delay D2 to generate the falling edge initiating signal via the inverting circuit 626. The second delay D2 may be set to a second sub-UI (e.g., 0.75*UI). When the first delay circuit 622 generates the rising edge initiating signal, the cascaded second delay circuit 624 and inverting circuit 626 output a logic high signal. In response, the AND gate 628 passes/outputs the rising edge initiating signal, which causes the transmit boost driver 630 to generate the rising edge of the second or boost portion $TX_{O2}$ of the output transmit signal $TX_O$. When the cascaded second delay circuit 624 and inverting circuit 626 generates the falling rising edge initiating signal, the first delay circuit 622 is outputting a logic high signal. In response, the AND gate 628 passes/outputs the falling edge initiating signal, which causes the transmit boost driver 630 to generate the falling edge of the second or boost portion $TX_{O2}$ of the output transmit signal $TX_O$. As the outputs of the main transmit driver 510 and the transmit boost driver 530 are coupled together, the first and second portions $TX_{O1}$ and $TX_{O2}$ combine or sum to form the output transmit signal $TX_O$.

Figure 6B:
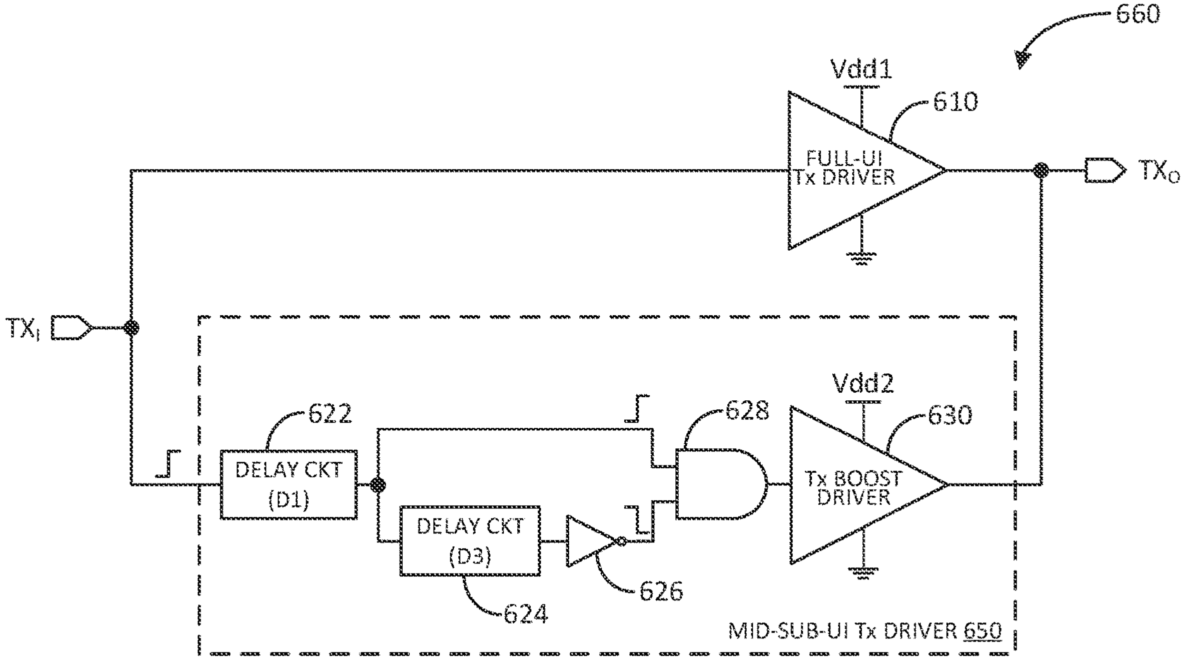

FIG. 6B illustrates a block diagram of another signal transmitter circuit 660 in accordance with another aspect of the disclosure. The signal transmitter circuit 660 is a variation of signal transmitter circuit 600 previously discussed, and includes many of the same/similar elements as indicated with the same reference numbers. The signal transmitter circuit 660 differs in that the mid-sub-UI transmit boost driver 650 includes a second delay circuit 624 that includes an input coupled to the output of the first delay circuit 622. The second delay circuit 624 may effectuate a third delay D3 (e.g., 0.5*UI), where the sum of the first and third delays D1+D3 (e.g., 0.25*UI+0.5*UI=0.75*UI) govern the generation of the falling edge initiating signal by the cascaded second delay circuit 654 and inverting circuit 626 in response to the rising edge of the input transmit signal $TX_I$.

Figure 7:
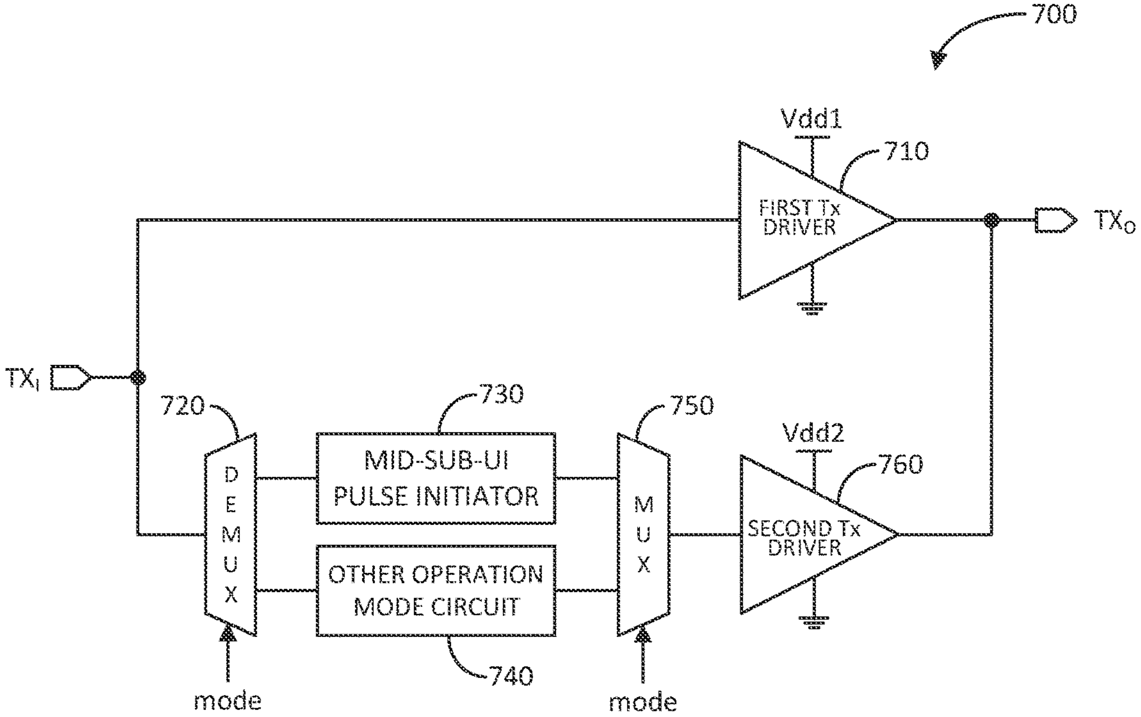
FIG. 7 illustrates a block diagram of another example signal transmitter circuit in accordance with another aspect of the disclosure.

FIG. 7 illustrates a block diagram of another example signal transmitter circuit 700 in accordance with another aspect of the disclosure. The signal transmitter circuit 700 may be an example of any of the M+N signal transmitter circuits of data/clock communication apparatus 100. As discussed further herein, the second transmit driver of the signal transmitter circuit 700 may selectively be repurposed for the mid-sub-UI boost operation previously discussed, or for another mode of operation (e.g., changing an output impedance of the signal transmitter circuit 700, increasing the slew rate of the edges/transitions of the output transmit signal $TX_O$, and/or other).

In particular, the signal transmitter circuit 700 includes a first transmit driver 710, a demultiplexer 720, a mid-sub-UI pulse initiator 730, other operation mode circuit 740, a multiplexer 750, and a second transmit driver 760. The first transmit driver 710, which may be coupled to and receive power from upper and lower voltage rails Vdd1 and Vss (e.g., ground), includes an input coupled to a signal input of the transmitter circuit 700 to receive an input transmit signal $TX_I$. The first transmit driver 710 is configured to amplify and/or voltage level shift the input transmit signal $TX_I$ to generate at least a portion of an output transmit signal $TX_O$.

The demultiplexer 720 includes an input coupled to the signal input of the signal transmitter circuit 700 to receive the input transmit signal $TX_I$, and a select input configured to receive a mode signal. The demultiplexer 720 includes outputs coupled to inputs of the mid-sub-UI boost pulse initiator 730 and other operation mode circuit 740, respectively. The mid-sub-UI boost pulse initiator 730 and other operation mode circuit 740 include outputs coupled to inputs of the multiplexer 750, respectively. The multiplexer 750 includes a select input configured to receive the mode signal. The multiplexer 750 includes an output coupled to an input of the second transmit driver 760. The second transmit driver 760, which may be coupled to and receive power from upper and lower voltage rails Vdd2 and Vss (e.g., ground), is configured to amplify and/or voltage level shift a selected signal received from the multiplexer 750 to generate another portion of the output transmit signal $TX_O$. Similarly, as previously discussed, the supply voltage Vdd2 for the second transmit driver 760 may be the same or different than the supply voltage Vdd1 for the first transmit driver 710.

In operation, if the mode signal indicates a mid-sub-UI boost operation, the demultiplexer 720 responsibly couples its input to the output coupled to the mid-sub-UI pulse initiator 730, and the multiplexer 750 responsibly couples the input coupled to the mid-sub-UI pulse initiator 730 to its output. In this mode of operation, the signal transmitter circuit 700 operates to perform a mid-sub-UI boosting of the output transmit signal $TX_O$, as previously discussed with reference to signal transmitter circuits 410, 500, 600, and 660. If the mode signal indicates another mode of operation (e.g., not mid-sub-UI boost operation), the demultiplexer 720 responsibly couples its input to the output coupled to the other operation mode circuit 740, and the multiplexer 750 responsibly couples the input coupled to the other operation mode circuit 740 to its output. In this mode of operation, the signal transmitter circuit 700 operates in accordance with the other mode of operation. The other operation mode circuit 740 may simply be an electrical conductor for routing the input transmit signal $TX_I$ directly to the second transmit driver 760, or a circuit that may process the input transmit signal $TX_I$ prior to it being sent to the second transmit driver 760.

Figure 8:
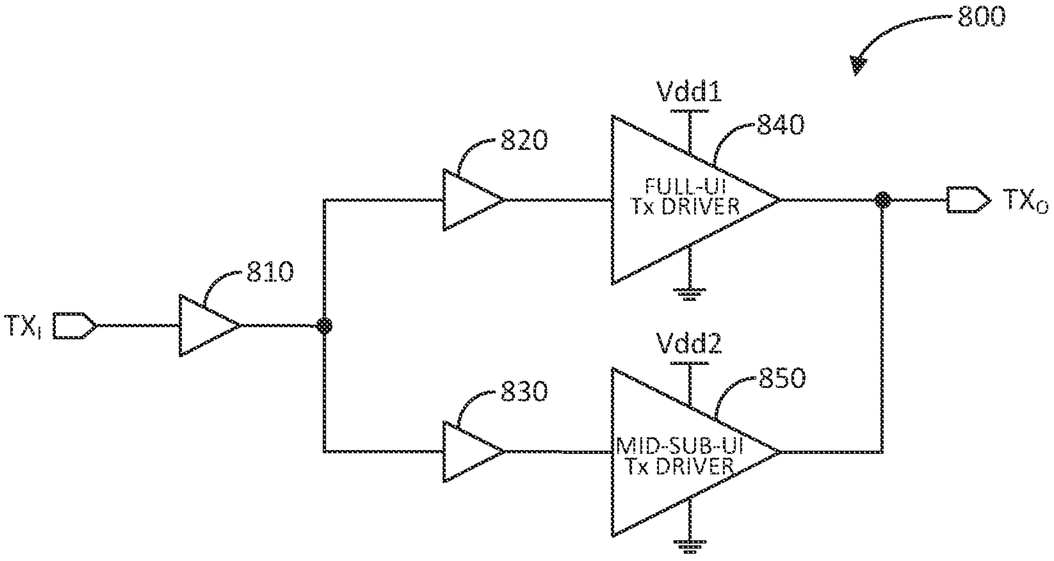
FIG. 8 illustrates a block diagram of another example signal transmitter circuit in accordance with another aspect of the disclosure.

FIG. 8 illustrates a block diagram of another example signal transmitter circuit 800 in accordance with another aspect of the disclosure. Any of the signal transmitter circuits 410, 500, 600, 660, and 700 previously discussed (as well as signal transmitter circuit 900 discussed further herein) may include one or more predrivers to amplify and/or voltage level shift the input transmit signal $TX_I$ in one or more stages prior to the signal being applied to the inputs of the main (full-UI) transmit driver and the mid-sub-UI transmit boost driver.

In this regard, the signal transmitter circuit 800 includes a first set of one or more predrivers 810, a second set of one or more predrivers 820, a third set of one or more predrivers 830, a main (full-UI) transmit driver 840, and a mid-sub-UI transmit boost driver 850. The first set of one or more predrivers 810 includes an input coupled to a signal input of the transmitter circuit 800 to receive the input transmit signal $TX_I$, and an output coupled to inputs of the second and third sets of predrivers 820 and 830, respectively. The second set of one or more predrivers 820 includes an output coupled to an input of the main (full-UI) transmit driver 840. The third set of one or more predrivers 830 includes an output coupled to an input of the mid-sub-UI transmit boost driver 850. The main (full-UI) transmit driver 840 and the mid-sub-UI transmit boost driver 850 include respective outputs together. The main (full-UI) transmit driver 840 and the mid-sub-UI boost driver 850 may be coupled to the same supply voltage rail (Vdd1 or Vdd2) or different supply voltage rails Vdd1 and Vdd2, and Vss (e.g., ground).

In operation, the first set of one or more predrivers 810 is configured to perform a first stage amplifying and/or voltage level shifting of the input transmit signal $TX_I$. The second set of one or more predrivers 820 is configured to perform a second stage amplifying and/or voltage level shifting of the input transmit signal $TX_I$ for the main (full-UI) transmit driver 840. The third set of one or more predrivers 830 is configured to perform a second stage amplifying and/or voltage level shifting of the input transmit signal $TX_I$ for the mid-sub-UI transmit boost driver 850. The main (full-UI) transmit driver 840 is configured to amplify and/or voltage level shift the signal generated by the second set of one or more predrivers 820 to generate at a first portion $TX_{O1}$ of an output transmit signal $TX_O$. The mid-sub-UI transmit boost driver 850 is configured to mid-sub-UI amplify and/or voltage level shift the signal generated by the third set of one or more predrivers 830 to generate at a second portion $TX_{O2}$ of an output transmit signal $TX_O$. The first and second portions $TX_{O1}$ and $TX_{O2}$ combine or sum at the common output of the main (full-UI) transmit driver 840 and a mid-sub-UI transmit boost driver 850 to generate the output transmit signal $TX_O$.

Figure 9:
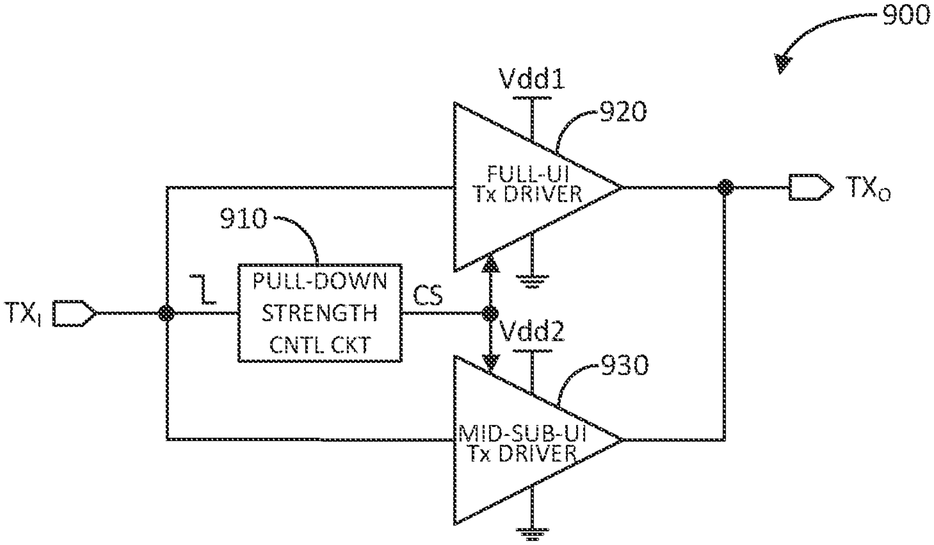
FIG. 9 illustrates a block diagram of another example signal transmitter circuit in accordance with another aspect of the disclosure.

FIG. 9 illustrates a block diagram of another example signal transmitter circuit 900 in accordance with another aspect of the disclosure. The previously discussed signal transmitter circuits 410, 500, 600, 660, 700, and 800 focused on providing a mid-sub-UI boost in the output transmit signal $TX_O$ to reduce a high-side dip in the input received signal $RX_I$ at an unterminated signal receiver circuit. However, as shown in the eye diagram corresponding to the input received signal $RX_I$ depicted in FIGS. 2-5, the input received signal $RX_I$ also exhibits a low-side bump that tends to close or reduce the height of the eye diagram. Accordingly, the signal transmitter circuit 900 is configured to reduce the low-side bump in the input received signal $RX_I$ to open up or increase the height of the eye diagram to improve the detectability of the data/clock.

In particular, the signal transmitter circuit 900 may be similar to the signal transmitter circuit 410 including a main (full-UI) transmit driver 920 and a mid-sub-UI transmit boost driver 930. The drivers 920 and 930 include respective inputs coupled together at a signal input of the signal transmitter circuit 900 to receive an input transmit signal $TX_I$. The drivers 920 and 930 similarly include respective outputs coupled together to collectively generate an output transmit signal $TX_O$, as previously discussed. Additionally, the signal transmitter circuit 900 includes a pull-down strength control circuit 910 including an input coupled to the signal input of the signal transmitter circuit 900, and an output coupled to one or more control inputs of the main (full-UI) transmit driver 920 and the mid-sub-UI transmit boost driver 930, respectively.

In operation, the pull-down strength control circuit 910 is configured to generate a control or configuration signal (CS) to increase the strength of the pull-down circuitry in the main (full-UI) transmit driver 920 and/or the mid-sub-UI transmit boost driver 930 in response to a falling edge of the input transmit signal $TX_I$. For example, the CS signal may cause an increase in the effective size or number of pull-down devices (e.g., field effect transistors (FETs)) in the drivers 920 and 930 to increase the slew rate of the falling edge of the output transmit signal $TX_O$. Accordingly, the slew rate of the falling edge may be greater than the slew rate of the rising edge in the output transmit signal $TX_O$. The increased slew rate of the falling edge, in turn, reduces the low-side bump in the input received signal $RX_I$ to open up or increase the height of the eye diagram to improve the detectability of the data/clock at the signal receiver circuit.

Figure 10:
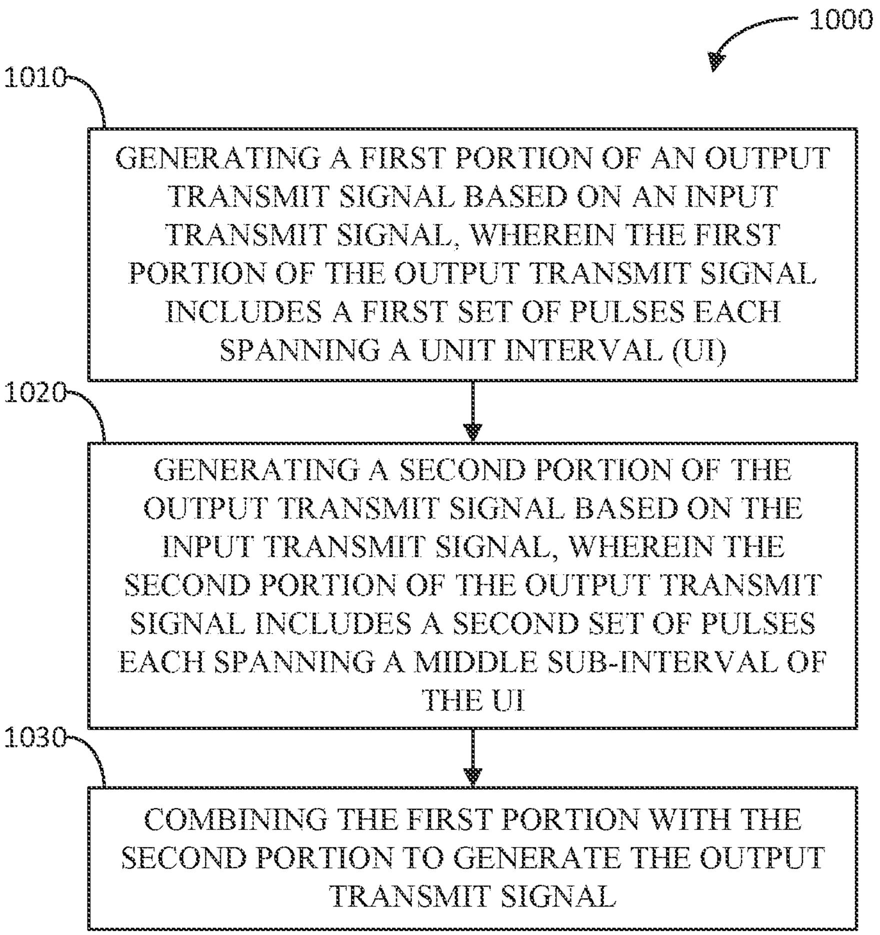
FIG. 10 illustrates a flow diagram of an example method of generating an output transmit signal in accordance with another aspect of the disclosure.

FIG. 10 illustrates a flow diagram of an example method 1000 of generating an output transmit signal in accordance with another aspect of the disclosure. The method 1000 includes generating a first portion of an output transmit signal based on an input transmit signal, wherein the first portion of the output transmit signal includes a first set of pulses each spanning a unit interval (UI) (block 1010). Examples of means for generating a first portion of an output transmit signal based on an input transmit signal, wherein the first portion of the output transmit signal includes a first set of pulses each spanning a unit interval (UI) include any of main (full-UI) transmit drivers 412, 510, 610, 710, 840, and 920.

The method 1000 further includes generating a second portion of the output transmit signal based on the input transmit signal, wherein the second portion of the output transmit signal includes a second set of pulses each spanning a middle sub-interval of the UI (block 1020). Examples of means for generating a second portion of the output transmit signal based on the input transmit signal, wherein the second portion of the output transmit signal includes a second set of pulses each spanning a middle sub-interval of the UI include any of mid-sub-UI transmit boost drivers 414, 520, 620, 650, 760, 850, and 930.

Additionally, the method 1000 includes combining the first portion with the second portion to generate the output transmit signal (block 1030). Examples of means for combining the first portion with the second portion to generate the output transmit signal include the output of any of the main (full-UI) transmit drivers 412, 510, 610, 710, 840, and 920 coupled to the output of any of the mid-sub-UI boost drivers 414, 520, 620, 650, 760, 850, and 930.

The following provides an overview of aspects of the present disclosure:

Aspect 1: An apparatus, comprising: a first transmit driver including an input coupled to a signal input; a first delay circuit including an input coupled to the signal input; a second delay circuit including an input coupled to the signal input or an output of the first delay circuit; an inverting circuit including an input coupled to an output of the second delay circuit; a logic gate including inputs coupled to outputs of the first delay circuit and the inverting circuit, respectively; and a second transmit driver including an input coupled to an output of the logic gate, and an output coupled to an output of the first transmit driver.

Aspect 2: The apparatus of aspect 1, wherein the logic gate comprises an AND function, an AND gate, or an exclusive-NOR (XNOR) gate.

Aspect 3: The apparatus of aspect 1 or 2, wherein the input of the second delay circuit is coupled to the signal input via the first delay circuit.

Aspect 4: The apparatus of aspect 1 or 2, wherein the input of the second delay circuit is coupled to the input of the first delay circuit.

Aspect 5: The apparatus of any one of aspects 1-4, further comprising a control circuit including an input coupled to the signal input and an output coupled to one or more control inputs of the first or second transmit driver, respectively.

Aspect 6: The apparatus of any one of aspects 1-5, further comprising: a demultiplexer comprising: an input coupled to the signal input; a select input configured to receive a mode signal; a first output coupled to the input of the first delay circuit or the inputs of the first and second delay circuits; and a second output coupled to an input of another operation mode circuit; and a multiplexer, comprising: a first input coupled to the output of the logic gate; a second input coupled to an output of the another operation mode circuit; a select input configured to receive the mode signal; and an output coupled to the input of the second transmit driver.

Aspect 7: The apparatus of any one of aspects 1-6, further comprising a first set of one or more predrivers including an input coupled to the signal input and an output coupled to the inputs of the first transmit driver and the first delay circuit.

Aspect 8: The apparatus of aspect 7, further comprising: a second set of one or more predrivers including an input coupled to the output of the first set of one or more predrivers, and an output coupled to the input of the first transmit driver; and a third set of one or more predrivers including an input coupled to the output of the first set of one or more predrivers, and an output coupled to the input of the first delay circuit.

Aspect 9: The apparatus of any one of aspects 1-8, further comprising: an upper supply voltage rail coupled to the first and second transmit drivers; and a lower supply voltage rail coupled to the first and second transmit drivers.

Aspect 10: The apparatus of any one of aspects 1-8, further comprising: a first upper supply voltage rail coupled to the first transmit driver; a second upper supply voltage rail coupled to the second transmit driver; and a lower supply voltage rail coupled to the first and second transmit drivers.

Aspect 11: The apparatus of any one of aspects 1-10, further comprising: a termination resistor including a first terminal coupled to the outputs of the first and second transmit drivers; and a capacitor including a first terminal coupled to a second terminal of the termination resistor, and a second terminal coupled to a supply voltage rail.

Aspect 12: An apparatus, comprising: a full unit interval (UI) transmit driver including an input coupled to a signal input; and a mid-sub-UI boost driver including an input coupled to the signal input and an output coupled to an output of the full UI transmit driver.

Aspect 13: The apparatus of aspect 12, wherein the mid-sub-UI boost driver comprises: a boost rising edge initiating circuit including an input coupled to the signal input; and/or a boost falling edge initiating circuit including an input coupled to the signal input; and a transmit boost driver including an input coupled to outputs of the boost rising edge initiating circuit and the boost falling edge initiating circuit, respectively.

Aspect 14: The apparatus of aspect 13, wherein the boost rising edge initiating circuit comprises a delay circuit.

Aspect 15: The apparatus of aspect 13 or 14, wherein the boosting falling edge initiating circuit comprises a delay circuit cascaded with an inverting circuit.

Aspect 16: The apparatus of aspect 12, wherein the mid-sub-UI boost driver comprises: a boost pulse initiating circuit including an input coupled to the signal input; and a transmit boost driver including an input coupled to an output of the boost pulse initiating circuit.

Aspect 17: The apparatus of aspect 16, wherein the boost pulse initiating circuit comprises: a first delay circuit including an input coupled to the signal input; a second delay circuit including an input coupled to the signal input; an inverting circuit including an input coupled to an output of the second delay circuit; and a logic gate including inputs coupled to outputs of the first delay circuit and the inverting circuit, respectively, and an output coupled to the input of the transmit boost driver.

Aspect 18: The apparatus of aspect 17, wherein the logic gate comprises an AND function, an AND gate, or an exclusive-NOR (XNOR) gate.

Aspect 19: The apparatus of aspect 17 or 18, wherein the input of the second delay circuit is coupled to the signal input via the first delay circuit.

Aspect 20: The apparatus of aspect 17 or 18, wherein the input of the second delay circuit is coupled to the input of the first delay circuit.

Aspect 21: An apparatus, comprising: a full-UI transmit driver configured to generate a first portion of an output transmit signal based on an input transmit signal, wherein the first portion of the output transmit signal includes a first set of pulses each spanning a unit interval (UI); and a mid-sub-UI boost driver configured to generate a second portion of the output transmit signal based on the input transmit signal, wherein the second portion of the output transmit signal includes a second set of pulses each spanning a middle sub-interval of the UI.

Aspect 22: The apparatus of aspect 21, wherein the mid-sub-UI boost driver comprises: a first delay circuit configured to generate a rising edge at a first delay after a rising edge of the input transmit signal per each of the second set of pulses; a second delay circuit configured to generate a falling edge at a second delay after the rising edge of the input transmit signal per each of the second set of pulses; and a boost driver configured to generate each of the second set of pulses based on the rising and falling edges generated by the first and second delay circuits, respectively.

Aspect 23: The apparatus of aspect 22, wherein the mid-sub-UI boost driver further comprises: an inverting circuit including an input coupled to an output of the second delay circuit; and a logic gate including inputs coupled to outputs of the first delay circuit and the inverting circuit, respectively, and an output coupled to an input of the boost driver.

Aspect 24: The apparatus of aspect 22 or 23, wherein the boost driver includes an output coupled to an output of the full-UI transmit driver.

Aspect 25: A method, comprising: generating a first portion of an output transmit signal based on an input transmit signal, wherein the first portion of the output transmit signal includes a first set of pulses each spanning a unit interval (UI); generating a second portion of the output transmit signal based on the input transmit signal, wherein the second portion of the output transmit signal includes a second set of pulses each spanning a middle sub-interval of the UI; and combining the first portion with the second portion to generate the output transmit signal.

Aspect 26: The method of aspect 25, wherein the first set of pulses are coincidental with the second set of pulses, respectively.

Aspect 27: The method of aspect 26, wherein: a rising edge of each pulse of the second set occurs a first time interval after a rising edge of each coincidental pulse of the first set; and a falling edge of each pulse of the second set occurs a second time interval before a falling edge of each coincidental pulse of the first set.

Aspect 28: The method of aspect 27, wherein the first and second time intervals are each substantially 0.25*UI.

Aspect 29: The method of aspect 27 or 28, wherein a slew rate of the falling edge of each of the first and second sets of pulses is greater than a slew rate of the rising edge of each of the first and second sets of pulses.

Aspect 30: The method of aspect 25, wherein generating the second portion of the output transmit signal is based on a first mode of operation, and further comprising: generating a third portion of the output transmit signal based on the input transmit signal and a second mode of operation, wherein the third portion is different than the second portion; and combining the first portion with the third portion to generate the output transmit signal in accordance with the second mode of operation.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:

a first transmit driver including an input coupled to a signal input;

a first delay circuit including an input coupled to the signal input;

a second delay circuit including an input coupled to the signal input or an output of the first delay circuit;

an inverting circuit including an input coupled to an output of the second delay circuit;

a logic gate including inputs coupled to outputs of the first delay circuit and the inverting circuit, respectively;

a second transmit driver including an input coupled to an output of the logic gate, and an output coupled to an output of the first transmit driver;

a first upper supply voltage rail coupled to the first transmit driver; and a second upper supply voltage rail coupled to the second transmit driver;

wherein the first upper supply voltage rail is different from the second upper supply voltage rail.

2. The apparatus of claim 1, wherein the logic gate comprises an AND function, an AND gate, or an exclusive-NOR (XNOR) gate.

3. The apparatus of claim 1, wherein the input of the second delay circuit is coupled to the signal input via the first delay circuit.

4. The apparatus of claim 1, wherein the input of the second delay circuit is coupled to the input of the first delay circuit.

5. The apparatus of claim 1, further comprising a control circuit including an input coupled to the signal input and an output coupled to one or more control inputs of the first or second transmit driver, respectively.

6. The apparatus of claim 1, further comprising:
a demultiplexer comprising:
an input coupled to the signal input;
a select input configured to receive a mode signal;
a first output coupled to the input of the first delay circuit or the inputs of the first and second delay circuits; and
a second output coupled to an input of another operation mode circuit; and
a multiplexer, comprising:
a first input coupled to the output of the logic gate;
a second input coupled to an output of the another operation mode circuit;
a select input configured to receive the mode signal; and
an output coupled to the input of the second transmit driver.

7. The apparatus of claim 1, further comprising a first set of one or more predrivers including an input coupled to the signal input and an output coupled to the inputs of the first transmit driver and the first delay circuit.

8. The apparatus of claim 7, further comprising:
a second set of one or more predrivers including an input coupled to the output of the first set of one or more predrivers, and an output coupled to the input of the first transmit driver; and
a third set of one or more predrivers including an input coupled to the output of the first set of one or more predrivers, and an output coupled to the input of the first delay circuit.

9. The apparatus of claim 1, further comprising:
an upper supply voltage rail coupled to the first and second transmit drivers; and
a lower supply voltage rail coupled to the first and second transmit drivers.

10. The apparatus of claim 1, further comprising:
a lower supply voltage rail coupled to the first and second transmit drivers.

11. The apparatus of claim 1, further comprising:
a termination resistor including a first terminal coupled to the outputs of the first and second transmit drivers; and
a capacitor including a first terminal coupled to a second terminal of the termination resistor, and a second terminal coupled to a supply voltage rail.

12. An apparatus, comprising:
a full unit interval (UI) transmit driver including an input coupled to a signal input; and
a mid-sub-UI boost driver including an input coupled to the signal input and an output coupled to an output of the full UI transmit driver;
wherein the mid-sub-UI boost driver comprises:
at least one initiating circuit coupled to the signal input; and
a transmit boost driver coupled to the at least one initiating circuit and configured to amplify an output signal from the at least one initiating circuit.

13. The apparatus of claim 12,
wherein the at least one initiating circuit comprises:
a boost rising edge initiating circuit including an input coupled to the signal input; and/or
a boost falling edge initiating circuit including an input coupled to the signal input; and
wherein the transmit boost driver includes an input coupled to outputs of the boost rising edge initiating circuit and the boost falling edge initiating circuit, respectively.

14. The apparatus of claim 13, wherein the boost rising edge initiating circuit comprises a delay circuit.

15. The apparatus of claim 13, wherein the boost falling edge initiating circuit comprises a delay circuit cascaded with an inverting circuit.

16. The apparatus of claim 12,
wherein the at least one initiating circuit comprises:
a boost pulse initiating circuit including an input coupled to the signal input; and
wherein the transmit boost driver includes an input coupled to an output of the boost pulse initiating circuit.

17. The apparatus of claim 16, wherein the boost pulse initiating circuit comprises:
a first delay circuit including an input coupled to the signal input;
a second delay circuit including an input coupled to the signal input;
an inverting circuit including an input coupled to an output of the second delay circuit; and
a logic gate including inputs coupled to outputs of the first delay circuit and the inverting circuit, respectively, and an output coupled to the input of the transmit boost driver.

18. The apparatus of claim 17, wherein the logic gate comprises an AND function, an AND gate, or an exclusive-NOR (XNOR) gate.

19. The apparatus of claim 17, wherein the input of the second delay circuit is coupled to the signal input via the first delay circuit.

20. The apparatus of claim 17, wherein the input of the second delay circuit is coupled to the input of the first delay circuit.

21. An apparatus, comprising:
a full-UI transmit driver configured to generate a first portion of an output transmit signal based on an input transmit signal, wherein the first portion of the output transmit signal includes a first set of pulses each spanning a unit interval (UI); and
a mid-sub-UI boost driver configured to generate a second portion of the output transmit signal based on the input transmit signal, wherein the second portion of the output transmit signal includes a second set of pulses each spanning a middle sub-interval of the UI;
wherein the mid-sub-UI boost driver comprises:
at least one delay circuit configured to receive the input transmit signal; and
a boost driver configured to amplify an output signal from the at least one delay circuit.

22. The apparatus of claim 21,
wherein the at least one delay circuit comprises:
a first delay circuit configured to generate a rising edge at a first delay after a rising edge of the input transmit signal per each of the second set of pulses; and
a second delay circuit configured to generate a falling edge at a second delay after the rising edge of the input transmit signal per each of the second set of pulses; and
wherein the boost driver is configured to generate each of the second set of pulses based on the rising and falling edges generated by the first and second delay circuits, respectively.

23. The apparatus of claim 22, wherein the mid-sub-UI boost driver further comprises:

an inverting circuit including an input coupled to an output of the second delay circuit; and a logic gate including inputs coupled to outputs of the first delay circuit and the inverting circuit, respectively, and an output coupled to an input of the boost driver.

24. The apparatus of claim 22, wherein the boost driver includes an output coupled to an output of the full-UI transmit driver.

* * * * *